(12) United States Patent
Luo

(10) Patent No.: US 11,127,799 B2
(45) Date of Patent: Sep. 21, 2021

(54) OPPOSITE SUBSTRATE AND PREPARATION METHOD THEREOF, DISPLAY PANEL AND PACKAGING METHOD

(71) Applicant: BOE TECHNOLOGY GROUP CO., LTD., Beijing (CN)

(72) Inventor: Chengyuan Luo, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 304 days.

(21) Appl. No.: 16/327,246

(22) PCT Filed: Jun. 6, 2018

(86) PCT No.: PCT/CN2018/090123
§ 371 (c)(1),
(2) Date: Feb. 21, 2019

(87) PCT Pub. No.: WO2019/041942
PCT Pub. Date: Mar. 7, 2019

(65) Prior Publication Data
US 2021/0074781 A1    Mar. 11, 2021

(30) Foreign Application Priority Data

Aug. 31, 2017  (CN) .................. 201710776007.6

(51) Int. Cl.
*H01L 27/32* (2006.01)
*H01L 51/52* (2006.01)
*H01L 51/56* (2006.01)

(52) U.S. Cl.
CPC ...... *H01L 27/3246* (2013.01); *H01L 51/5212* (2013.01); *H01L 51/5228* (2013.01);
(Continued)

(58) Field of Classification Search
CPC ............. H01L 27/3246; H01L 51/5212; H01L 51/5228; H01L 51/5253; H01L 51/56; H01L 2227/323
See application file for complete search history.

(56) References Cited

U.S. PATENT DOCUMENTS 9,761,641 B2    9/2017  Liu
2012/0013830 A1*  1/2012  Asada ................ G02F 1/13394
                                                              349/106
(Continued)

FOREIGN PATENT DOCUMENTS

CN    104112767 A    10/2014
CN    105118928 A    12/2015
(Continued)

OTHER PUBLICATIONS

International Search Report and Written Opinion dated Aug. 29, 2018, from application No. PCT/CN2018/090123.

*Primary Examiner* — Lex H Malsawma
(74) *Attorney, Agent, or Firm* — Arch & Lake LLP

(57) ABSTRACT

The present disclosure provides an opposite substrate. The opposite substrate includes a substrate. The opposite substrate includes spacer pillars distributed on the substrate as an array. The opposite substrate includes an auxiliary electrode layer covering the spacer pillars and the substrate, and a lubricant layer. The lubricant layer covers portions of the auxiliary electrode layer corresponding to the spacer pillars.

18 Claims, 4 Drawing Sheets

(52) U.S. Cl.
  CPC .......... *H01L 51/5253* (2013.01); *H01L 51/56* (2013.01); *H01L 2227/323* (2013.01)

(56) References Cited

U.S. PATENT DOCUMENTS

2017/0033164 A1* 2/2017 Liu .................. G02B 5/223
2017/0317152 A1* 11/2017 Hsu .................. H01L 27/32
2017/0349762 A1* 12/2017 Sasaki .................. C09D 5/02
2018/0190940 A1 7/2018 Liu et al.

FOREIGN PATENT DOCUMENTS

| | | |
|---|---|---|
| CN | 106953020 A | 7/2017 |
| CN | 104112767 B | 9/2017 |
| CN | 107579168 A | 1/2018 |
| CN | 207265056 U | 4/2018 |
| EP | 3 235 887 A1 | 10/2017 |
| WO | WO-2016/015421 A1 | 2/2016 |
| WO | WO-2016/098336 A1 | 6/2016 |

* cited by examiner

OPPOSITE SUBSTRATE AND PREPARATION METHOD THEREOF, DISPLAY PANEL AND PACKAGING METHOD

CROSS REFERENCE OF RELATED APPLICATIONS

The present application is based upon International Application No. PCT/CN2018/090123, filed on Jun. 6, 2018, which claims the priority of Chinese Patent Application No. 201710776007.6, filed on Aug. 31, 2017, and the entire contents thereof are incorporated herein by reference as part of the present application.

TECHNICAL FIELD

The present disclosure relates to the field of display technologies, and in particular, to an opposite substrate, a method of preparing the same, a display panel and a packaging method.

BACKGROUND

An OLED (Organic Light-Emitting Diode) display is a new type of display device. Compared with liquid crystal displays, OLED displays have advantages of self-illumination, fast response and wide viewing angle, and can be used for flexible display, transparent display and 3D display. Therefore, the OLED displays have been rapidly developed and popularized.

At present, an OLED display panel is generally packaged by means of adhesive package. The process of using the adhesive package includes: forming an adhesive film on an opposite substrate, and forming a cell assembly by an array substrate (i.e., a substrate formed with an OLED structure) and the opposite substrate, to complete the package.

It should be noted that the information disclosed in the Background section above is only for enhancing the understanding of the background of the present disclosure, and thus may include information that does not constitute prior art known to those of ordinary skill in the art.

SUMMARY

The present disclosure relates to an opposite substrate. The opposite substrate includes a substrate. The opposite substrate includes spacer pillars distributed on the substrate as an array. The opposite substrate includes an auxiliary electrode layer covering the spacer pillar and the substrate, and a lubricant layer. The lubricant layer covers portions of the auxiliary electrode layer corresponding to the spacer pillars.

In some arrangements, the lubricant layer includes nanoparticles, and surfaces of the nanoparticles are wrapped by hydrophilic organic materials.

In some arrangements, the nanoparticles include at least one of titanium dioxide, silicon dioxide and zinc oxide.

In some arrangements, the hydrophilic organic material includes at least one of aliphatic carboxylic acid, hydroxyethyl acrylate, hydroxypropyl acrylate and N-methylol acrylamide.

In some arrangements, the lubricant layer has a thickness of about 100 nm to 300 nm.

In some arrangements, the spacer pillars each has a tapered structure and a top end of each of the spacer pillars is arc-shaped.

In some arrangements, the auxiliary electrode layer is a high light transmittance electrode layer, and the high light transmittance electrode layer has a light transmittance not less than 90%.

The present disclosure further relates to a display panel. The display panel includes an array substrate and an opposite substrate according to the present disclosure. A top electrode is formed on the array substrate. The spacer pillar is disposed opposite to the top electrode. An auxiliary electrode layer covering the spacer pillars is in contact with a top electrode covered on a pixel defining layer.

The present disclosure further relates to a method of preparing an opposite substrate. The method includes forming spacer pillars distributed as an array on the substrate. The method includes forming an auxiliary electrode layer on the spacer pillars. The auxiliary electrode layer covers on the spacer pillars and the substrate. The method includes forming a lubricant layer on portions of the auxiliary electrode layer corresponding to the spacer pillars.

In some arrangements, forming a lubricant layer on portions of the auxiliary electrode layer corresponding to the spacer pillars includes coating nanoparticles with surfaces wrapped by hydrophilic organic materials on the portions of the auxiliary electrode layer corresponding to the spacer pillars by spray coating or spin coating to form the lubricant layer.

In some arrangements, the lubricant layer has a thickness of about 100 nm to 300 nm.

In some arrangements, before forming spacer pillars distributed in an array on the substrate, the method further includes forming a black matrix and a color pixel unit on a base substrate. The method further includes forming a planarization layer on the black matrix and the color pixel unit. The method further includes forming auxiliary electrode columns distributed in an array on the planarization layer, to obtain the substrate. Forming spacer pillars distributed as an array on the substrate includes forming the spacer pillars on the auxiliary electrode column.

The present disclosure further relates to a method of packaging a display panel. The method includes preparing an array substrate and the opposite substrate according to the present disclosure. A top electrode is formed on the array substrate. The method includes applying a package adhesive on the array substrate or the opposite substrate. The method includes pressing the array substrate against the opposite substrate, such that the spacer pillar faces the top electrode and an auxiliary electrode layer covered on the spacer pillar is in contact with a top electrode covered on a pixel defining layer.

The present disclosure further relates to a display panel. The display panel includes a cell assembly including a first substrate and a second substrate. The display panel includes a spacer pillar, formed on at least one of the first substrate and the second substrate to maintain a spacing between the first substrate and the second substrate. The display panel includes a lubricant layer, at least covered on a top surface of the spacer pillar.

In some arrangements, the lubricant layer includes nanoparticles, and surfaces of the nanoparticles are wrapped by hydrophilic organic materials.

In some arrangements, the nanoparticles include at least one of titanium dioxide, silicon dioxide and zinc oxide.

In some arrangements, the hydrophilic organic material includes at least one of aliphatic carboxylic acid, hydroxyethyl acrylate, hydroxypropyl acrylate and N-methylol acrylamide.

In some arrangements, the lubricant layer has a thickness of about 100 nm to 300 nm.

In some arrangements, the spacer pillar has a tapered structure and a top end of the spacer pillar is arc-shaped.

In some arrangements, the display panel further includes a package adhesive coated between the first substrate and the second substrate, and the lubricant layer is not infiltrated by the package adhesive.

This section provides an overview of various implementations or examples of the techniques described in the present disclosure, and is not a comprehensive disclosure of all scopes or all features of the disclosed technology.

BRIEF DESCRIPTION OF THE DRAWINGS

In order to more clearly illustrate the arrangements of the present disclosure or the technical solutions in the prior art, the drawings to be used in the arrangements or the description of the prior art will be briefly described below. Obviously, the drawings in the following description are only certain arrangements of the present disclosure, and other drawings can be obtained from those skilled in the art based on these drawings without any creative work.

DETAILED DESCRIPTION

In order to make the above objects, features and improvements of the present disclosure more apparent and obvious, the present disclosure will be further described in detail below with reference to the accompanying drawings and specific arrangements.

Figure 1A:
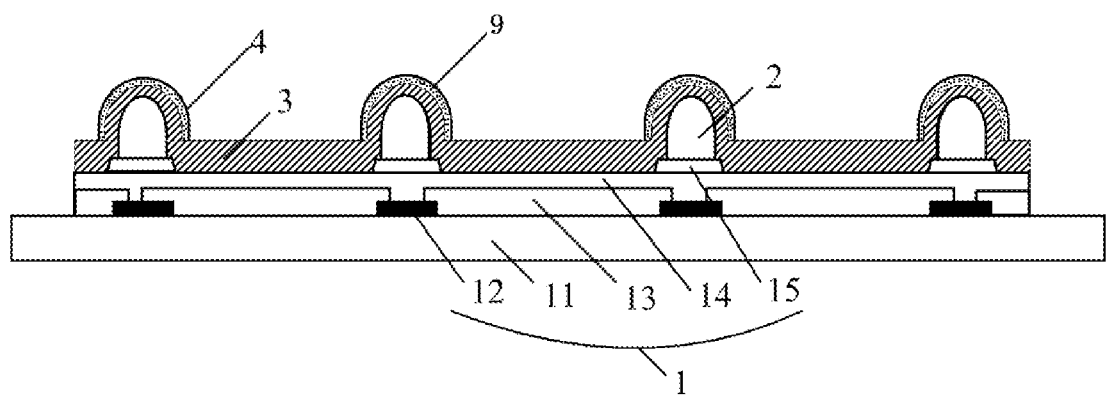
FIG. 1A is a structural block diagram of an opposite substrate according to an arrangement of the present disclosure.
Figure 1B:
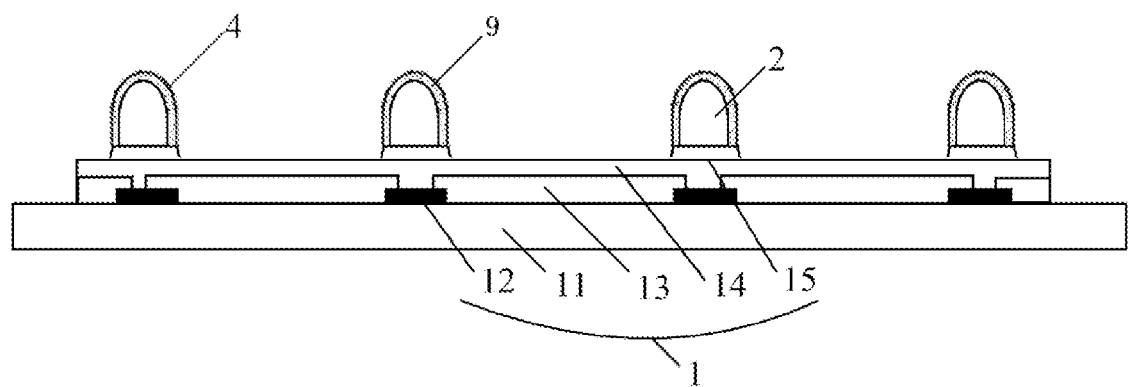
FIG. 1B is a structural block diagram of an opposite substrate according to an arrangement of the present disclosure.

Referring to FIG. 1A and FIG. 1B, a structural block diagram of an opposite substrate (for example, a color film substrate) according to an arrangement of the present disclosure is shown, which specifically includes:

a substrate 1, spacer pillars 2 distributed on the substrate 1 in an array, an auxiliary electrode layer 3 covering the spacer pillar 2 and the substrate, and a lubricant layer 4 at least covering the auxiliary electrode layer 3 corresponding to the spacer pillar 2.

In practical applications, the lubricant layer 4 may cover the auxiliary electrode layer 3 corresponding to the spacer pillar 2, or the lubricant layer 4 may be formed on the auxiliary electrode layer 3 by a single process, which is not specifically limited in this disclosure. The lubricant layer is formed on the auxiliary electrode layer by a single process, the lubricant layer entirely covers on the auxiliary electrode layer on the substrate, so that distribution of nanoparticles contained in the lubricant layer are relatively uniform. Since the uniform distribution of the nanoparticles has a light scattering effect to some extent, light reflection of the auxiliary electrode layer can be reduced.

In the arrangement, the substrate 1 includes: a base substrate 11, a black matrix 12, a color pixel unit 13, a planarization layer 14 disposed on the black matrix 12 and the color pixel unit 13, and auxiliary electrode pillars 15 distributed in an array on the planarization layer 14. The spacer pillars 2 are distributed on the substrate 1 in an array. The auxiliary electrode column 15 is used to increase the conductivity of the auxiliary electrode layer and the top electrode. The spacer pillar is generally of a photoresist material and formed by a process such as exposure, developing, baking, etc. The spacer pillar has a tapered structure and the top end of the spacer pillar is arc-shaped. Such a structure can prevent excessive deposition of the package adhesive at the top of the spacer pillar and further affecting the conductivity.

A height of the spacer pillar may be set according to actual process requirements, which is not specifically limited by the present disclosure. Optionally, the spacer pillar has a height from 5 micrometers to 10 micrometers.

In addition, it should be understood that in the specific application of the present disclosure, the auxiliary electrode layer 3 is a structure that can be omitted. For example, as shown in FIG. 1B, the lubricant layer 4 may be formed directly on the array of spacer pillars 2, which is not specifically limited by the present disclosure.

The lubricant layer includes nanoparticles 9 whose surfaces are coated with hydrophilic organic materials. The surface of the nanoparticle is coated with hydrophilic organic materials, and then sliding friction becomes a rolling friction force, such that the package adhesive is more easily to be pushed away, thus reducing the contact resistance between the auxiliary electrode layer and the top electrode.

The nanoparticle includes at least one of titanium dioxide, silicon dioxide and zinc oxide, and the nanoparticle is a transparent spherical nanoparticle. Optionally, the nanoparticle has a particle diameter from 10 nm to 50 nm, which is not specifically limited by the present disclosure.

The hydrophilic organic material includes at least one of aliphatic carboxylic acid, hydroxyethyl acrylate, hydroxypropyl acrylate and N-methylol acrylamide.

A thickness of the lubricant layer may be set according to actual process requirements, which is not specifically limited by the present disclosure. Optionally, the thickness of the lubricant layer is from 100 nm to 300 nm.

In practical applications, the auxiliary electrode layer generally adopts a high light transmittance electrode layer, and the high light transmittance electrode layer has a light transmittance not less than 90%.

The material of the high light transmittance electrode layer includes at least one of magnesium, silver, aluminum, copper, indium zinc oxide IZO, and indium tin oxide ITO, and formed by physical deposition (PVD) or evaporation.

When the material of the auxiliary electrode layer is magnesium, silver, aluminum, copper, optionally, the auxiliary electrode layer has a thickness from 10 nm to 15 nm, and it may also be other thicknesses, which is not specifically limited by the present disclosure. When the material of the auxiliary electrode layer is indium zinc oxide IZO or indium tin oxide ITO, the thickness of the auxiliary electrode layer is from 50 nm to 150 nm, or the auxiliary electrode layer may be of other thicknesses, which is not specifically limited by the present disclosure.

In this arrangement, the color film substrate includes: a substrate, spacer pillars distributed on the substrate in an array, an auxiliary electrode layer covering the spacer pillar and the substrate, and a lubricant layer covering at least portions of the auxiliary electrode layer that correspond to the spacer pillars. The lubricant layer allows the auxiliary electrode layer to more easily contact the top electrode, thus improving the conductivity of the entire display panel.

Moreover, the oxide nanoparticles are spherical nanoparticles and the surfaces thereof are coated with hydrophilic organic materials. The coated hydrophilic material repels the epoxy resin which is the main component of the package adhesive, and scratches to the device from the nanoparticles can be prevented. Meanwhile, the spherical nanoparticles is rollable, and in this way, the sliding friction becomes a rolling friction force, the package adhesive is more easily to be pushed away, thus reducing the contact resistance between the auxiliary electrode layer and the top electrode, and improving the conductivity of the auxiliary electrode layer and the top electrode.

Figure 2:
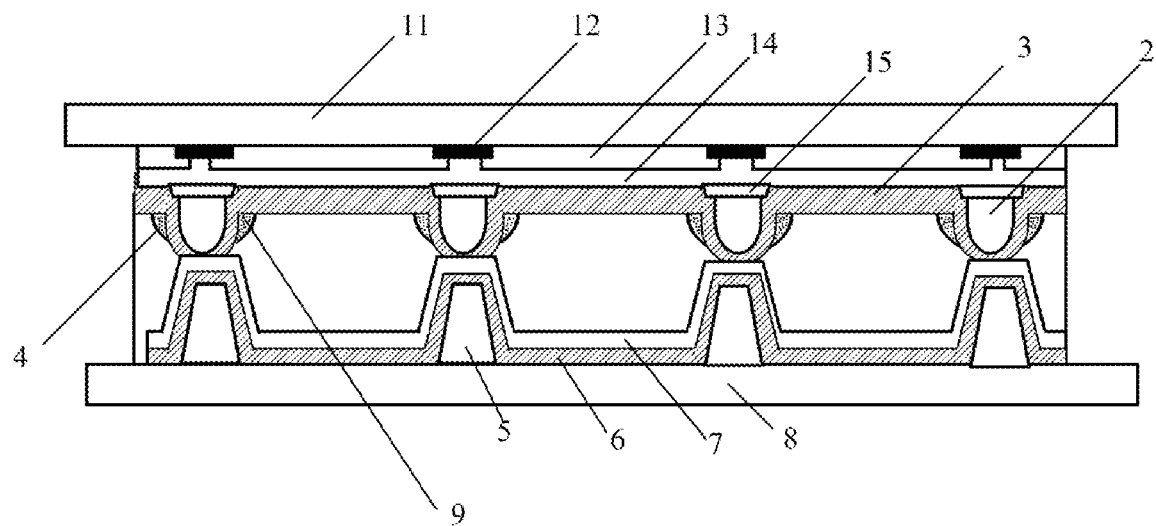
FIG. 2 is a structural block diagram of a display panel according to an arrangement of the present disclosure.

Referring to FIG. 2, it is a structural block diagram of a display panel according to an arrangement of the present disclosure, which includes an array substrate and the color film substrate according to the foregoing arrangement. The top electrode 7 is formed on the array substrate. The spacer pillar 2 is disposed opposite to the top electrode 7. The auxiliary electrode layer 3 covering the spacer pillar and the top electrode 7 covering the pixel defining layer (PDL) 5 are in contact with each other. In this case, a lubricant layer formed on the top (for example, one end away from the substrate) of the spacer pillar (or auxiliary electrode layer) is pushed away and aggregated at the bottom of the spacer pillar (for example, one end close to the substrate).

The array substrate further includes an OLED substrate 8 and an organic layer EL 6. The PDL 5 covers the OLED substrate 8, the EL 6 covers the PDL 5, and the top electrode 7 covers the EL6.

It should be noted that, the display panel in this arrangement can be applied to any product or component having a display function, such as a mobile phone, a tablet computer, a television, a notebook computer, a digital photo frame, a navigator, and the like.

The display panel has all the improvements of the color film substrate in the above arrangements, and details are not described herein again.

It should be understood that, in the present arrangement, the display panel is formed of the array substrate and the color film substrate, and the lubricant layer is formed on the auxiliary electrode on the color film substrate. However, those skilled in the art should understand that the present disclosure is not limited thereto. Based on the concept of the present disclosure, the display panel may also include other substrates, not limited to the aforementioned array substrates and color film substrates. In addition, it should also be understood that the lubricant layer of the present disclosure is capable of achieving its technical purpose regardless of whether or not the above auxiliary electrode is formed.

Therefore, an arrangement of the present disclosure further relates to a display panel. The display panel includes a first substrate and a second substrate formed a cell assembly with the first substrate. The display panel includes a spacer pillar, formed on at least one of the first substrate and the second substrate to maintain a spacing between the first substrate and the second substrate. The display panel includes a lubricant layer covering at least a top surface of the spacer pillar. The lubricant layer may be the lubricant layer described in the foregoing arrangement, and the description thereof will not be repeated herein.

In addition, those skilled in the art should also understand that in the process of forming a cell assembly by the first substrate and the second substrate of the present disclosure, a package adhesive is applied between the first substrate and the second substrate, and the lubricant layer is not infiltrated by the package adhesive, which facilitates achieving the purpose of changing the sliding friction force into the rolling friction force and facilitates extruding the package adhesive.

It should be understood that in the case where the above-described auxiliary electrode is not formed, the present arrangement can have improvements except for those related to the auxiliary electrode in the foregoing arrangements. For example, it is possible to prevent the nanoparticles from being scratched by the device, and the spherical nanoparticles is rollable, so that the sliding friction becomes a rolling friction force, then the package adhesive is more easily to be pushed away, thus reducing the contact resistance between the spacer pillar and the substrate.

Figure 3:
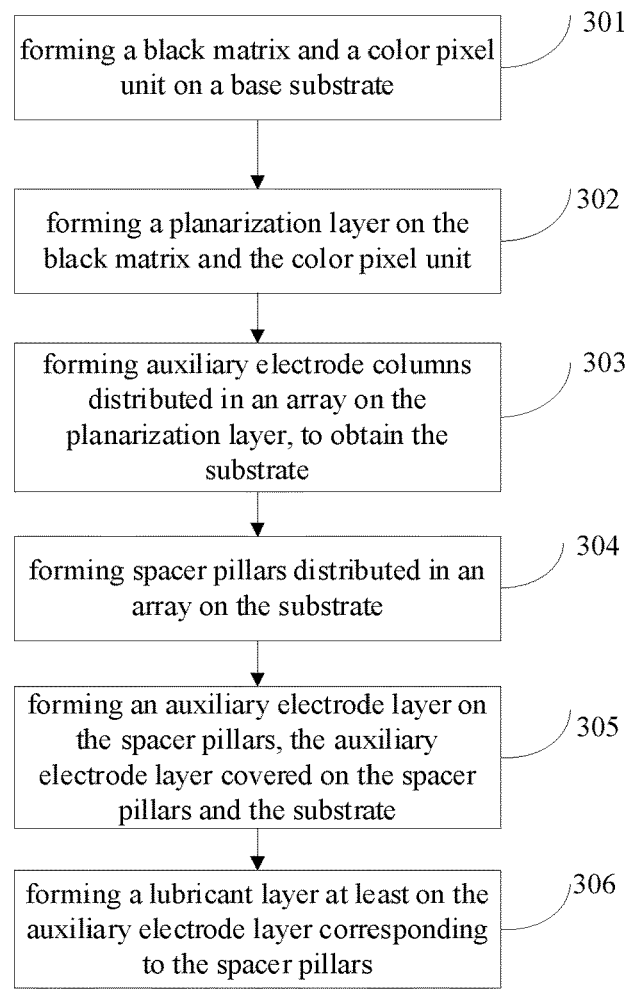
FIG. 3 is a flow chart of a method of preparing an opposite substrate according to an arrangement of the present disclosure.

Referring to FIG. 3, it is a flowchart of a method of preparing a color film substrate according to an arrangement of the present disclosure, which can include the following blocks.

Figure 4:
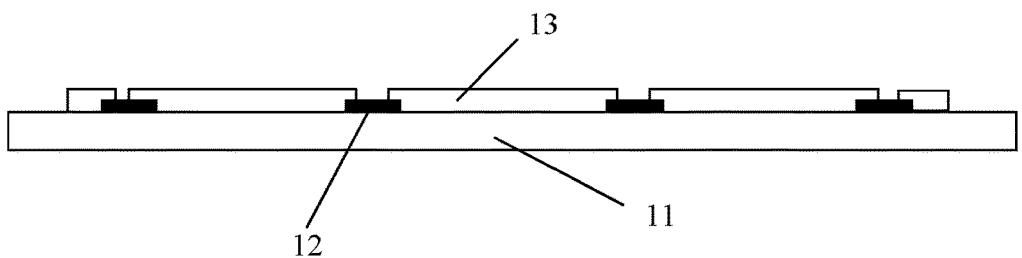
FIG. 4 is a schematic structural view of forming a black matrix and a color pixel unit according to the present disclosure.

Block 301: a black matrix and a color pixel unit are formed on a base substrate, as shown in FIG. 4.

Figure 5:
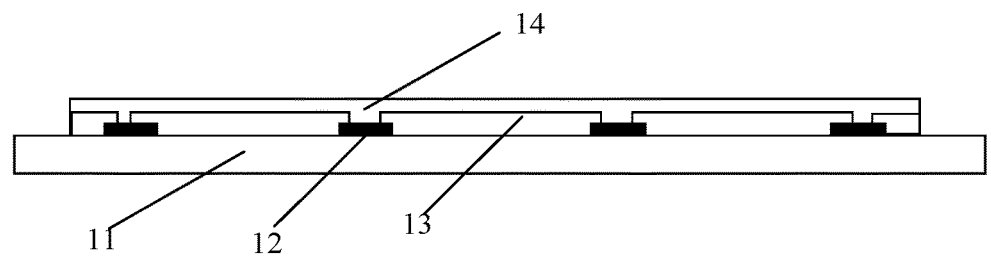
FIG. 5 is a schematic structural view of forming a planarization layer according to the present disclosure.

Block 302: a planarization layer is formed on the black matrix and the color pixel unit, as shown in FIG. 5.

Figure 6:
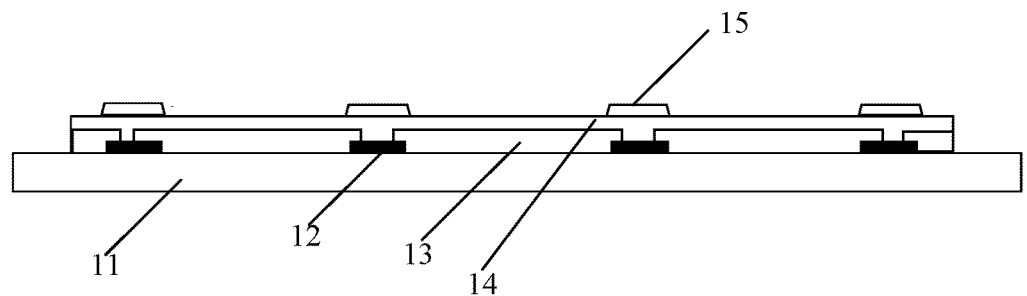
FIG. 6 is a schematic structural view of forming the auxiliary electrode column according to the present disclosure.

Block 303: auxiliary electrode columns distributed in an array are formed on the planarization layer, to obtain the substrate, as shown in FIG. 6.

Figure 7:
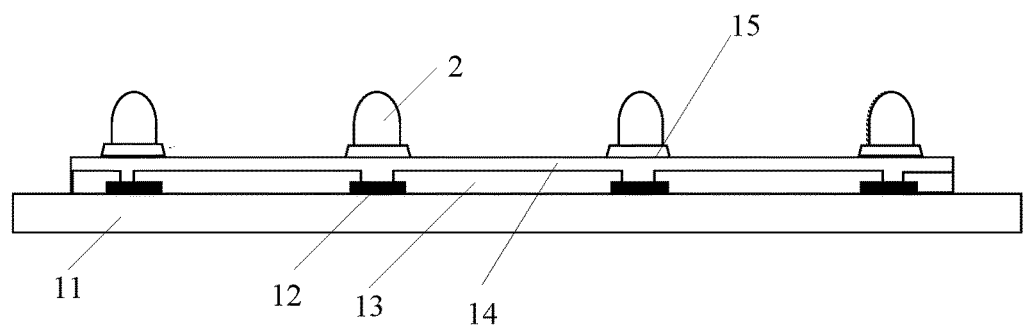
FIG. 7 is a schematic structural view of forming spacer pillars in an array distribution according to the present disclosure.

Block 304: spacer pillars distributed in an array are formed on the substrate, as shown in FIG. 7.

Preferably, the forming spacer pillars distributed in an array on the substrate includes: forming the spacer pillars on the auxiliary electrode column.

Figure 8:
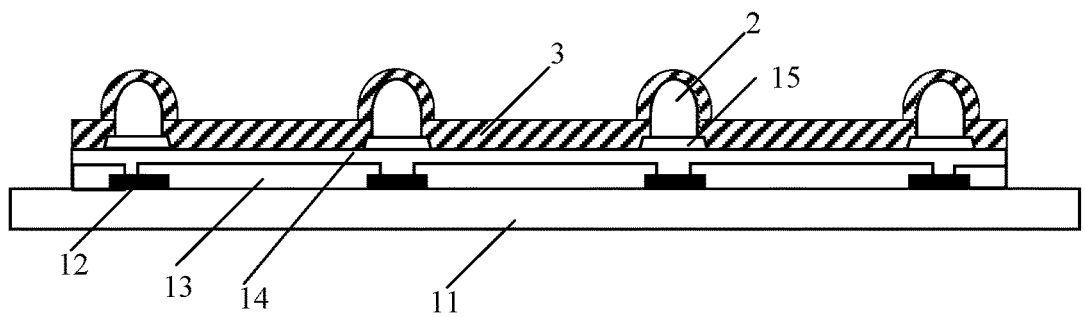
FIG. 8 is a schematic structural view of forming an auxiliary electrode layer according to the present disclosure.

Block 305: an auxiliary electrode layer is formed on the spacer pillars, the auxiliary electrode layer covering the spacer pillars and the substrate, as shown in FIG. 8.

Block 306: a lubricant layer is formed at least on the auxiliary electrode layer corresponding to the spacer pillars, as shown in FIG. 1B.

Optionally, the forming a lubricant layer at least on the auxiliary electrode layer corresponding to the spacer pillars includes:

coating nanoparticles with surfaces thereof wrapped by hydrophilic organic materials on at least the auxiliary electrode layer corresponding to the spacer pillar by spray coating or spin coating to form the lubricant layer. That is, the lubricant layer is formed on the auxiliary electrode layer corresponding to the spacer pillar by spraying coating or spin coating. Alternatively, the lubricant layer is formed on the auxiliary electrode layer by spraying coating or spin coating. The lubricant layer has a thickness of 100 nm to 300 nm.

In this arrangement, the color film substrate includes: a substrate, spacer pillars distributed on the substrate in an array, an auxiliary electrode layer covering the spacer pillar and the substrate, and a lubricant layer covering at least portions of the auxiliary electrode layer corresponding to the spacer pillars. The lubricant layer allows the auxiliary electrode layer to better contact with the top electrode, thus improving the electrical conductivity of the entire display panel.

Moreover, the oxide nanoparticles are spherical nanoparticles and the surfaces thereof are coated with hydrophilic organic materials. The coated hydrophilic material repels the epoxy resin which is the main component of the package adhesive, and scratches to the device from the nanoparticles can be prevented. In addition, the spherical nanoparticles is rollable, and in this way, the sliding friction becomes a rolling friction force, the package adhesive is more easily to be pushed away, thus reducing the contact resistance between the auxiliary electrode layer and the top electrode, and improving the conductivity of the auxiliary electrode layer and the top electrode.

Figure 9:
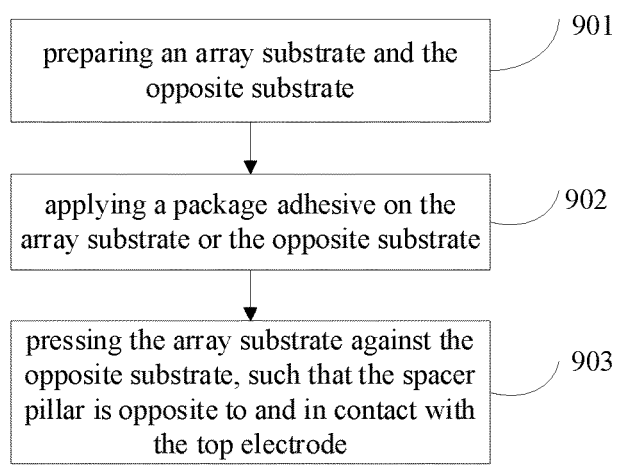
FIG. 9 is a flowchart of a method of packaging a display panel according to an arrangement of the present disclosure.

Referring to FIG. 9, it is a flowchart of a method of packaging a display panel according to an arrangement of the present disclosure, which can include the following blocks.

Block 901: the array substrate and the color film substrate described in the foregoing arrangements are prepared.

In the arrangement, a top electrode is formed on the array substrate.

Block 902: a package adhesive is applied on the array substrate or the color film substrate.

It should be noted that the specific process of forming the package adhesive can adopt the existing adhesive film forming technology. The film may be formed on the lubricant layer of the color film substrate, or may be formed on the array substrate or on the color film substrate. Optionally, the package adhesive is formed on the lubricant layer, and at this time, it is more beneficial for achieving the conductive effect.

Block 903: the array substrate is pressed against the color film substrate, such that the spacer pillar faces the top electrode and an auxiliary electrode layer covering the spacer pillar contacts with a top electrode covering a pixel defining layer.

Specifically, the array substrate and the color film substrate forming the package adhesive are adhered to each other by the package adhesive to complete the pressing package. Alternatively, the package adhesive is applied to the periphery of the color film substrate and the array substrate forming the lubricant layer, to form a cell assembly.

Figure 10:
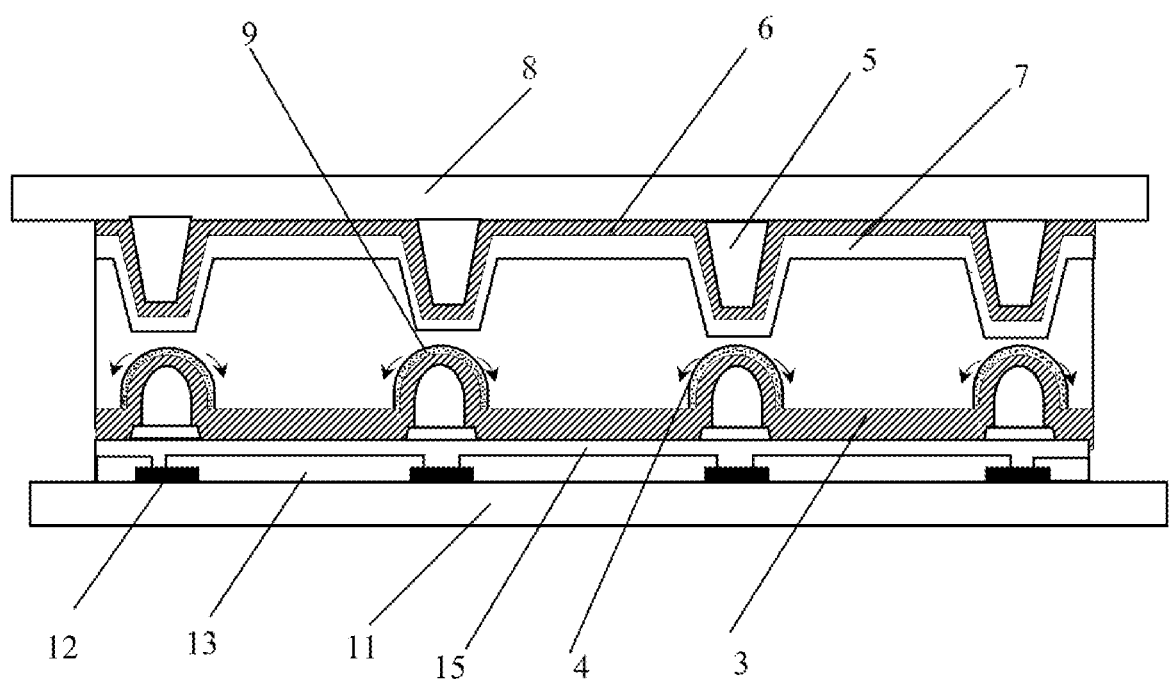
FIG. 10 is a schematic structural view of a display panel package of the present disclosure.

The package substrate formed through the above blocks is as shown in FIG. 10. In FIG. 10, when the array substrate and the color film substrate are pressed against each other, the spacer pillar and the top electrode face and contact each other. In this way, the nanoparticles in the lubricant layer covering the spacer pillar can move the package adhesive on the array substrate or the color film substrate along two sides of the spacer pillar, so that the top electrode and the auxiliary electrode layer can be more easily contacted, and the conductivity is improved.

The packaging method of the display panel has all the improvements in the above arrangements, and details are not described herein again.

It should be noted that, as for the foregoing method arrangements, for the sake of simple description, they are all expressed as a combinations a series of actions, but those skilled in the art should understand that the present disclosure is not limited by the described order. In accordance with the present disclosure, certain blocks may be performed in other order or concurrently. In addition, those skilled in the art should also understand that the arrangements described in the specification are all optional arrangements, and the actions involved are not necessarily required by the present disclosure.

The various arrangements in the present specification are described in a progressive manner, and each arrangement focuses on differences from other arrangements, and the same similar parts between the various arrangements can be referred to each other.

It will be readily apparent to those skilled in the art that any combination of the various arrangements described above is possible, and any combination between the various arrangements described above is an arrangement of the present disclosure, but due to space limitation, the present specification will not describe one by one herein.

It should be noted that, in this context, relational terms such as first and second, etc. are used merely to distinguish one entity or operation from another entity or operation, and do not necessarily require or imply any such actual relationship or order between these entities or operations. Moreover, the terms "include" and "including" not only include those elements but also include other elements not specifically listed, or also includes elements inherent to such a process, method, article or device. Without more restrictions, an element defined by the phrase "including" does not exclude the presence of the same element in the process, method, item, or device that includes the element.

Moreover, "and/or" in the above means that both the relationship of "and" and the relationship of "or" are included in the text. If the relationship between the scheme A and the scheme B is "and", it indicates the scheme A and the scheme B may be included an arrangement at the same time; if the relationship between the scheme A and the scheme B is "or", it means that the scheme A may be separately included in an arrangement, or the scheme B may be separately included in an arrangement.

While the preferred arrangement of the present disclosure has been described, it will be apparent that those skilled in the art can make further changes and modifications to the arrangements once learning about the basic creative concepts. Therefore, the appended claims are intended to be interpreted as including the preferred arrangements and all modifications and amendments falling in the scope of the present disclosure.

The color film substrate, the preparation method thereof, the display panel and the packaging method provided by the present disclosure are described in detail above. The principles and arrangements of the present disclosure are described by applying specific examples, and the description of the above arrangements is only used to help understand the method and its core idea of the present disclosure; at the same time, for those skilled in the art, according to the idea of the present disclosure, there will be changes in the specific implementation and application scope. In summary, the contents of this specification are not to be construed as limiting the present disclosure.

What is claimed is:

1. An opposite substrate, comprising: a substrate, spacer pillars distributed on the substrate in an array, and a lubricant layer covering the spacer pillars;
   wherein the lubricant layer comprises nanoparticles, and respective surfaces of the nanoparticles are wrapped by hydrophilic organic materials.

2. The opposite substrate according to claim 1, wherein the nanoparticles each comprises at least one of: titanium dioxide, silicon dioxide and zinc oxide.

3. The opposite substrate according to claim 1, wherein the hydrophilic organic material comprises at least one of: aliphatic carboxylic acid, hydroxyethyl acrylate, hydroxypropyl acrylate, and N-methylol acrylamide.

4. The opposite substrate according to claim 1, wherein the lubricant layer has a thickness of about 100 nanometers (nm) to 300 nm.

5. The opposite substrate according to claim 1, wherein the spacer pillars each has a tapered structure and an end of each of the spacer pillars away from the substrate is arc-shaped.

6. The opposite substrate according to claim 1, wherein the opposite substrate further comprises an auxiliary electrode layer disposed between the spacer pillars and the lubricant layer.

7. The opposite substrate according to claim 6, wherein the auxiliary electrode layer is a high light transmittance electrode layer, and the high light transmittance electrode layer has a light transmittance not less than 90%.

8. A method of packaging a display panel, comprising:
   preparing an array substrate and an opposite substrate according to claim 1, wherein a top electrode is formed on the array substrate;
   applying a package adhesive on the array substrate or the opposite substrate;
   pressing the array substrate against the opposite substrate, such that the spacer pillars are opposite to and in contact with the top electrode.

9. A method of preparing an opposite substrate, comprising:
   forming spacer pillars distributed in an array on the substrate; and
   forming a lubricant layer over the spacer pillars;
   wherein forming a lubricant layer on the spacer pillar comprises:
   coating nanoparticles with respective surfaces wrapped by hydrophilic organic materials on the spacer pillars by spray coating or spin coating to form the lubricant layer.

10. The method according to claim 9, wherein the lubricant layer has a thickness of about 100 nanometers (nm) to 300 nm.

11. The method according to claim 9, wherein before forming spacer pillars distributed as an array on the substrate, the method further comprises:
   forming a black matrix and a color pixel unit on a base substrate;
   forming a planarization layer on the black matrix and the color pixel unit; and
   forming auxiliary electrode columns distributed in an array on the planarization layer to obtain the substrate, and
   wherein forming spacer pillars distributed in an array on the substrate comprising:
   forming the spacer pillars on the auxiliary electrode columns.

12. A display panel, comprising:
   an array substrate; and
   an opposite substrate, comprising a substrate, spacer pillars distributed on the substrate in an array, and a lubricant layer covering the spacer pillars,
   wherein a top electrode is formed on the array substrate, the spacer pillars are disposed opposite to the top electrode, and an auxiliary electrode layer covering the spacer pillars is in contact with the top electrode which covers a pixel defining layer.

13. The display panel according to claim 12, wherein the lubricant layer is aggregated at one end of the spacer pillars close to the substrate.

14. The display panel according to claim 12, wherein the lubricant layer comprises nanoparticles, and respective surfaces of the nanoparticles are wrapped by hydrophilic organic materials.

15. The display panel according to claim 14, wherein the nanoparticles comprise at least one of: titanium dioxide, silicon dioxide and zinc oxide.

16. The display panel according to claim 14, wherein the hydrophilic organic material comprises at least one of: aliphatic carboxylic acid, hydroxyethyl acrylate, hydroxypropyl acrylate and N-methylol acrylamide.

17. The display panel according to claim 12, wherein the lubricant layer has a thickness of about 100 nm to 300 nm.

18. The display panel according to claim 12, wherein the spacer pillars each has a tapered structure and an end of each of the spacer pillars away from the substrate is arc-shaped.

* * * * *